US009426933B2

(12) United States Patent
Yanagida et al.

(10) Patent No.: US 9,426,933 B2
(45) Date of Patent: Aug. 23, 2016

(54) RESONANCE TYPE NON-CONTACT POWER FEEDING SYSTEM, POWER TRANSMISSION SIDE APPARATUS AND IN-VEHICLE CHARGING APPARATUS OF RESONANCE TYPE NON-CONTACT POWER FEEDING SYSTEM

(75) Inventors: You Yanagida, Susono (JP); Shinji Ichikawa, Toyota (JP); Satoru Horiuchi, Toyota (JP)

(73) Assignees: YAZAKI CORPORATION, Tokyo (JP); TOYOTA JIDOSHA KABUSHIKI KAISHA, Aichi-ken (JP)

( * ) Notice: Subject to any disclaimer, the term of this patent is extended or adjusted under 35 U.S.C. 154(b) by 505 days.

(21) Appl. No.: 14/110,785

(22) PCT Filed: Apr. 20, 2012

(86) PCT No.: PCT/JP2012/061309
§ 371 (c)(1),
(2), (4) Date: Oct. 9, 2013

(87) PCT Pub. No.: WO2012/144658
PCT Pub. Date: Oct. 26, 2012

(65) Prior Publication Data
US 2014/0029233 A1    Jan. 30, 2014

(30) Foreign Application Priority Data

Apr. 22, 2011 (JP) ................................ 2011-096366

(51) Int. Cl.
*H01F 38/14*        (2006.01)
*H02J 17/00*        (2006.01)
(Continued)

(52) U.S. Cl.
CPC ................ *H05K 9/00* (2013.01); *B60L 11/182* (2013.01); *H01F 27/346* (2013.01); *H01F 27/36* (2013.01);
(Continued)

(58) Field of Classification Search
CPC ............ B60L 11/182; B60L 2270/147; B60L 11/1838; Y02T 10/7072; Y02T 10/7088; Y02T 90/122; H01F 38/14; H01F 27/02; H01F 27/346; H02J 5/005; H02J 7/025; H02J 17/00; H01Q 1/526
See application file for complete search history.

(56) References Cited

U.S. PATENT DOCUMENTS

2008/0180332 A1    7/2008  Noro et al.
2009/0079270 A1    3/2009  Jin
(Continued)

FOREIGN PATENT DOCUMENTS

CN        1707905 A     12/2005
CN     101425702 A      5/2009
(Continued)

OTHER PUBLICATIONS

Communication dated Mar. 30, 2015 issued by the State Intellectual Property Office of the People's Republic of China in counterpart Chinese Patent Application No. 201280019811.5.
(Continued)

*Primary Examiner* — Ryan Johnson
(74) *Attorney, Agent, or Firm* — Sughrue Mion, PLLC

(57) ABSTRACT

A resonance type non-contact power feeding system 10 includes, as a power reception side (secondary side) apparatus, a load device 50, a secondary coil 40, a secondary resonance coil 45, and a rectifier 160. A battery 52 is provided inside a load housing 54 of the load device 50. In addition, like a power transmission side metal shield 80 on the power transmission side, the resonance type non-contact power feeding system 10 includes a power reception side metal shield 90 that covers the secondary coil 40 and the secondary resonance coil 45, and a rectifier shield 170 that covers the rectifier 160. Moreover, a power reception side large metal shield 130 that covers the outside of the power reception side metal shield 90 and the rectifier shield 170 is provided.

5 Claims, 6 Drawing Sheets

(51) Int. Cl.
*B60L 11/18* (2006.01)
*H02J 5/00* (2016.01)
*H02J 7/02* (2016.01)
*H01F 27/34* (2006.01)
*H05K 9/00* (2006.01)
*H01F 27/36* (2006.01)
*H01Q 1/52* (2006.01)
*H01Q 7/00* (2006.01)

(52) U.S. Cl.
CPC ............... *H01F 38/14* (2013.01); *H01Q 1/526* (2013.01); *H01Q 7/00* (2013.01); *H02J 7/025* (2013.01); *H02J 50/12* (2016.02); *B60L 2270/147* (2013.01); *H02J 5/005* (2013.01); *Y02T 10/7005* (2013.01); *Y02T 10/7072* (2013.01); *Y02T 90/122* (2013.01); *Y02T 90/14* (2013.01)

(56) References Cited

U.S. PATENT DOCUMENTS

| | | |
|---|---|---|
| 2009/0206675 A1 | 8/2009 | Camurati et al. |
| 2010/0065352 A1 | 3/2010 | Ichikawa |
| 2010/0225271 A1 | 9/2010 | Oyobe et al. |
| 2010/0295506 A1 | 11/2010 | Ichikawa |
| 2011/0018358 A1 | 1/2011 | Kozakai |
| 2011/0018494 A1 | 1/2011 | Mita |
| 2011/0121778 A1 | 5/2011 | Oyobe et al. |
| 2011/0148351 A1 | 6/2011 | Ichikawa |
| 2011/0214926 A1* | 9/2011 | Ichikawa ............... B60L 5/005 180/2.1 |
| 2011/0316349 A1 | 12/2011 | Hashiguchi et al. |
| 2012/0032525 A1 | 2/2012 | Oyobe et al. |
| 2012/0146431 A1 | 6/2012 | Ichikawa et al. |
| 2012/0153894 A1* | 6/2012 | Widmer ............... H04B 5/0037 320/108 |
| 2012/0242447 A1* | 9/2012 | Ichikawa ............... B60L 11/182 336/84 C |
| 2012/0262005 A1 | 10/2012 | Camurati et al. |
| 2012/0267959 A1 | 10/2012 | Camurati et al. |
| 2012/0267963 A1 | 10/2012 | Camurati et al. |
| 2012/0306439 A1 | 12/2012 | Ichikawa et al. |

FOREIGN PATENT DOCUMENTS

| | | |
|---|---|---|
| CN | 101835653 A | 9/2010 |
| CN | 101964551 A | 2/2011 |
| CN | 101964678 A | 2/2011 |
| JP | H07094246 A | 4/1995 |
| JP | 2010-70048 A | 4/2010 |
| JP | 2010-219838 A | 9/2010 |
| WO | 2007/107642 A1 | 9/2007 |
| WO | 2010/032309 A1 | 3/2010 |
| WO | 2010131348 A1 | 11/2010 |
| WO | 2010/150317 A1 | 12/2010 |

OTHER PUBLICATIONS

International Search Report dated Apr. 23, 2013 issued in International Application No. PCT/JP2012/061309.

Written Opinion dated Apr. 23, 2013 issued in International Application No. PCT/JP2012/061309.

* cited by examiner

RESONANCE TYPE NON-CONTACT POWER FEEDING SYSTEM, POWER TRANSMISSION SIDE APPARATUS AND IN-VEHICLE CHARGING APPARATUS OF RESONANCE TYPE NON-CONTACT POWER FEEDING SYSTEM

TECHNICAL FIELD

The present invention relates to a resonance type non-contact power feeding system, and a power transmission side apparatus and an in-vehicle charging apparatus of the resonance type non-contact power feeding system.

BACKGROUND ART

A technique for supplying power to a load device using a non-contact system is known. As a product applying such a technique, charging systems of portable phones are generally used. Moreover, in recent years, as power feeding systems for electric vehicles, non-contact power feeding systems are at the stage of commercialization, and various standards have been determined.

As the non-contact power feeding system, there are various types such as an "electromagnetic induction type", a "radio wave type", and a "resonance type". In addition, one kind attracting attention as a power feeding system for electronic vehicles and the like is the resonance type. FIG. 1 is a diagram showing the principle of a resonance type non-contact power feeding system, and the basic principle thereof has been developed and proven by MIT (Massachusetts Institute of Technology). In the resonance type non-contact power feeding system illustrated, a high-frequency power source and a power transmission loop (primary coil) are directly coupled, and a power reception loop (secondary coil) and a load are directly coupled. This system configures a resonance system in which power is transmitted contactlessly. Specifically, a power transmission side (primary side) device includes the high-frequency power source, the power transmission loop, and a primary resonance coil. A power reception side (secondary side) device includes a secondary resonance coil, the secondary coil, and the load (battery). In this system, as the power transmission side device and the power reception side device are subjected to magnetic field coupling (are electromagnetically coupled) by resonance, there is a possibility of about several kilowatts of power being transmitted for a relatively long distance. For example, there are research reports stating that power can be supplied to a space distant by about several meters with a high transmission efficiency (sometimes around 50%).

From such characteristics, wide research and development on the resonance type non-contact power feeding system have been made, and a technique for realizing an improvement in power transmission efficiency (for example, refer to PTL 1), a shield technique for allowing the system to function as an actual apparatus (for example, refer to PTL 2), and the like are disclosed.

Here, the necessity of the shield technique will be simply described. FIG. 2 shows a model when a basic model shown in FIG. 1 is actually mounted in a system. AC power is output from a high-frequency power source, and is supplied to a power transmission side resonance coil portion on a transmission line. By electromagnetic coupling that is intensified by the resonant action between the power transmission side resonance coil portion and a power reception side resonance coil portion, the AC power is transmitted to the power reception side resonance coil portion contactlessly. The AC power transmitted to the power reception side resonance coil portion is supplied to a rectifier on the transmission line. DC power converted from the AC power by the rectifier is supplied to a battery by the transmission line.

As such, in an actual system, a transmission path between a power source and a primary resonance portion and a transmission path between a secondary resonance portion and a rectifier are needed, and the transmission paths are also included in a resonance system. Therefore, electromagnetic coupling also occurs in the transmission paths (transmission wires). As a result, an electromagnetic field (radiated electromagnetic field) is generated from the transmission paths by induced current. The electromagnetic field radiated here is lost and the transmission efficiency is reduced. In addition, the electromagnetic field (radiated electromagnetic field) generated from the power transmission side resonance coil portion and the power reception side resonance coil portion is radiated into a space. This is also a loss, and the transmission efficiency is reduced.

CITATION LIST

Patent Literature

PTL1: JP-A-2010-219838
PTL2: JP-A-2010-70048

SUMMARY OF INVENTION

Technical Problem

However, although the resonance type enables highly efficient transmission by increasing an electromagnetic coupling efficiency between the power transmission side resonance coil portion and the power reception side resonance coil portion as described above, the electromagnetic field generated from both the resonance coil portions and the electromagnetic field generated from the transmission lines cause a reduction in the transmission efficiency. As a countermeasure, as shown in FIG. 3, a resonance type non-contact power feeding system having a shield case provided for a resonance coil portion may be considered. This is the same technique described in PTL 2. However, although an improvement in a transmission efficiency reduction caused by the electromagnetic field from the resonance coil portion and suppression of the intensity of the electromagnetic field can be achieved, the problem caused by the electromagnetic field generated from the transmission paths still remains.

Solution to Problem

In consideration of this situation, it is an object of the present invention is to provide a technique that solves the problem.

According to an aspect of the present invention, there is provided a resonance type non-contact power feeding system which transmits power from a power transmission side resonance coil portion to a power reception side resonance coil portion by a non-contact resonance action, wherein a power transmission side apparatus including the power transmission side resonance coil portion includes a power transmission side coaxial cable which electrically connects a high-frequency power source to the power transmission side resonance coil portion, a first power transmission side shielding unit covering the power transmission side resonance coil portion from outside with a good conductor, and a second power transmission side shielding unit covering the power transmission side coaxial cable and the first power transmission side shielding unit, wherein an external conductor of the power transmission side coaxial cable, the first power transmission side shielding unit, a housing of the high-frequency power source, and the second power transmission side shielding unit are connected at the same potential, wherein a power reception side apparatus including the power reception side resonance coil portion includes a first power reception side shielding unit covering the power reception side resonance coil portion from outside with a good conductor, a second power reception side shielding unit covering a rectifier that rectifies alternating current generated in the power reception side resonance coil portion into direct current, from outside with a good conductor, a third power reception side shielding unit for covering the first power reception side shielding unit and the second power reception side shielding unit, and an output line shielding unit for covering, in output lines from the rectifier to a load device, the output line in a section from the third power reception side shielding unit to a housing of the load device, and wherein the first power reception side shielding unit, the second power reception side shielding unit, the third power reception side shielding unit, and the output line shielding unit are connected at the same potential.

In addition, the second power transmission side shielding unit and the third power reception side shielding unit may respectively have surfaces extending outward at opposing end portions thereof.

According to another aspect of the present invention, there is provided an in-vehicle charging apparatus which, by a resonance type non-contact power feeding method for transmitting power from a power transmission side resonance coil portion to a power reception side resonance coil portion by a non-contact resonance action, mounts the power reception side resonance coil portion and a battery in a vehicle to perform charging, including: a first power reception side shielding unit covering the power reception side resonance coil portion from outside with a good conductor; a second power reception side shielding unit covering a rectifier that rectifies alternating current generated in the power reception side resonance coil portion into direct current, from outside with a good conductor; a third power reception side shielding unit covering the first power reception side shielding unit and the second power reception side shielding unit; and output line shielding unit covering, in output lines from the rectifier to a load device, the output line in a section from the third power reception side shielding unit to a housing of the load device, wherein the first power reception side shielding unit, the second power reception side shielding unit, the third power reception side shielding unit, and the output line shielding unit are connected at the same potential.

In addition, the third power reception side shielding unit may be configured integrally with a vehicle body.

According to still another aspect of the present invention, there is provided a power transmission side apparatus having a power transmission side resonance coil portion in a resonance type non-contact power feeding system which transmits power from the power transmission side resonance coil portion to a power reception side resonance coil portion by a non-contact resonance action, including: a power transmission side coaxial cable which electrically connects a high-frequency power source to the power transmission side resonance coil portion; a first power transmission side shielding unit covering the power transmission side resonance coil portion from outside with a good conductor; and a second power transmission side shielding unit covering the power transmission side coaxial cable and the first power transmission side shielding unit, wherein an external conductor of the power transmission side coaxial cable, the first power transmission side shielding unit, a housing of the high-frequency power source, and the second power transmission side shielding unit are connected at the same potential.

Advantageous Effects of Invention

According to the present invention, a technique for reducing a radiated electromagnetic field which is unnecessary in a resonance type non-contact power feeding system can be provided.

DESCRIPTION OF EMBODIMENTS

Hereinafter, an embodiment for embodying the present invention (hereinafter, referred to as an "embodiment") will be described with reference to the drawings. A resonance type non-contact power feeding system of this embodiment includes a vehicle side apparatus mounted in a vehicle and an infrastructure side apparatus installed in a parking space, an energy station, or the like and is used for charging an electric vehicle or the like. In addition, the resonance type non-contact power feeding system has the following configurations (1) to (11):

(1) A power reception side resonance coil portion mounted in the vehicle is covered with a shield case insulated from an internal resonance coil.

(2) Just by the side of the power reception side resonance coil portion mounted in the vehicle, a rectifier for converting AC power into DC power is provided.

(3) The rectifier is covered with a shield case insulated from a power supply line from the power reception side resonance coil portion and a power output line to a battery.

(4) The shield case of the rectifier is connected to the shield case of the power reception side resonance coil portion, and both the shield cases are electrically at the same potential.

(5) The shield cases of the power reception side resonance coil portion and the rectifier are connected to a vehicle body and are at the same potential as that of the vehicle body.

(6) Each shield case has a size of a degree so as not to affect an electromagnetic coupling state between the power reception side resonance coil portion mounted in the vehicle and a power transmission side resonance coil portion mounted on the infrastructure side.

(7) The power output line from the rectifier to the battery is shielded by the potential of the vehicle body.

(8) In the infrastructure side apparatus, a shield case covering the power transmission side resonance coil portion and an external conductor of a coaxial cable which is a power supply line are connected to each other.

(9) In the infrastructure side apparatus, on the outside of the shield case covering the power transmission side resonance coil portion and the coaxial cable, a second layer shield structure covering them is disposed.

(10) In the infrastructure side apparatus, the second layer shield structure and a housing of a high-frequency power source are electrically connected to each other.

(11) In an area where the intensity of an electromagnetic field between the power transmission side resonance coil portion and the power reception side resonance coil portion is high, the second layer shield structure is disposed.

Hereinafter, detailed description will be provided.

Figure 1:
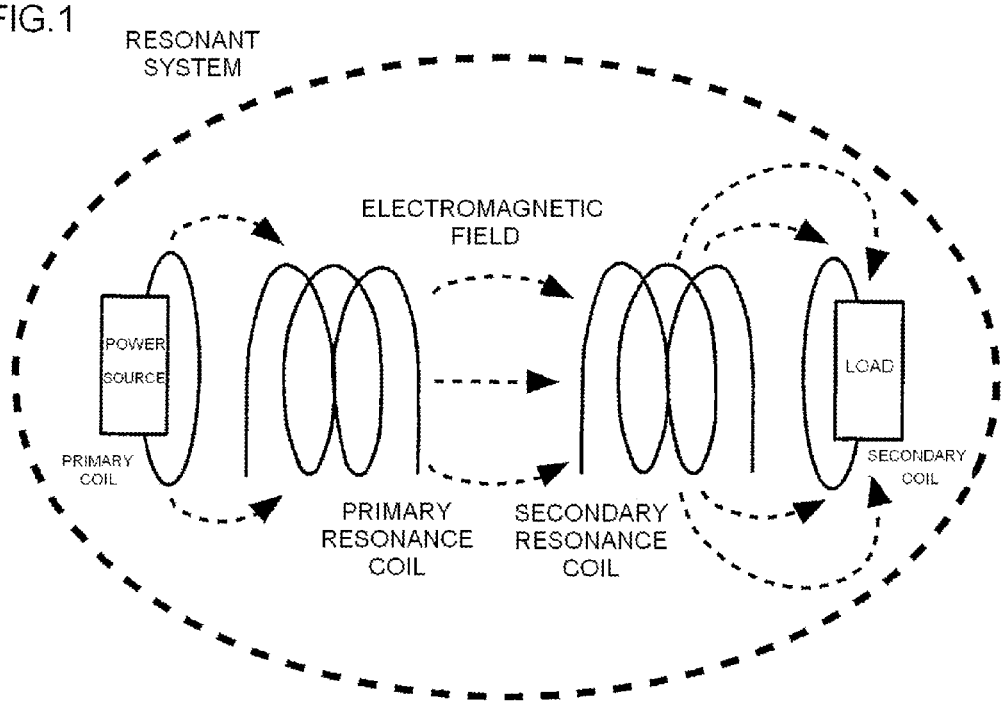
FIG. 1 is a diagram for explaining a basic principle of a resonance type non-contact power feeding system according to the related art.
Figure 2:
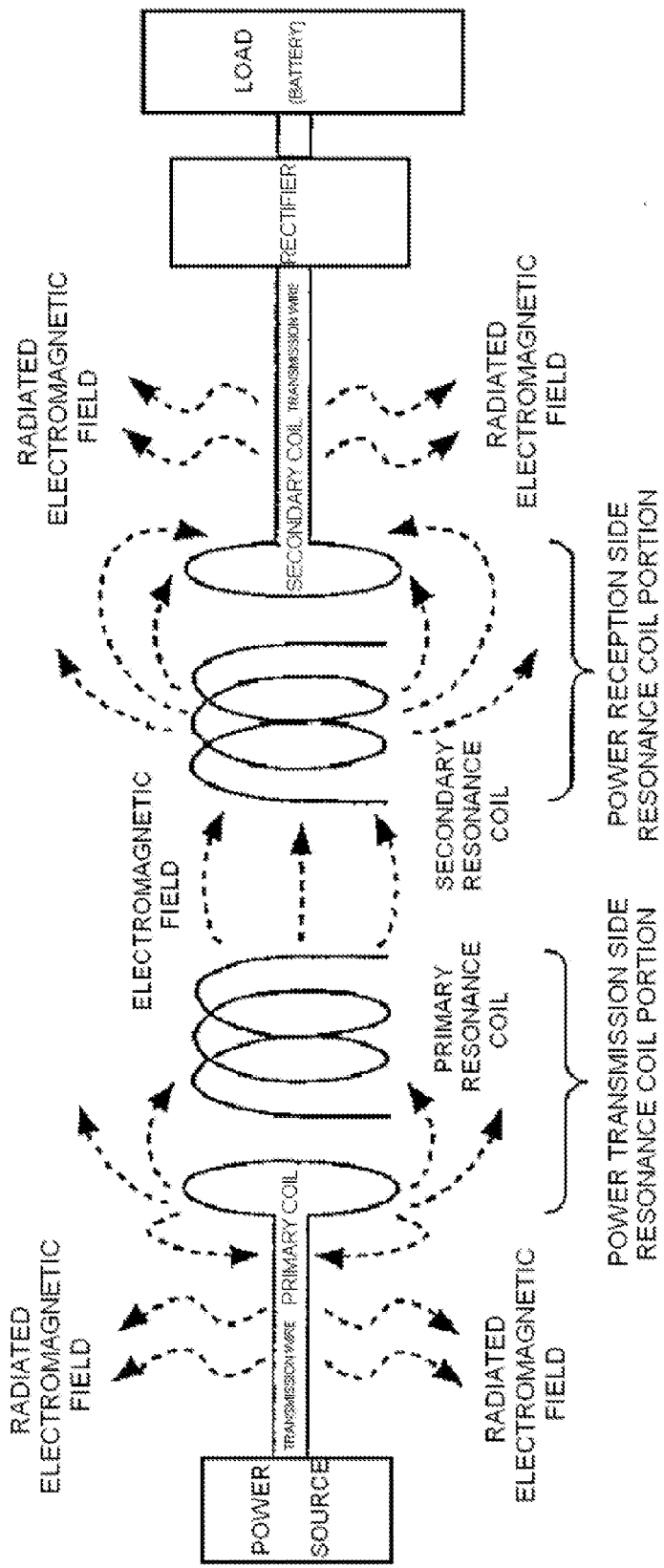
FIG. 2 is a diagram schematically showing a configuration in a case where the resonance type non-contact power feeding system of FIG. 1 according to the related art is mounted in an actual system.
Figure 3:
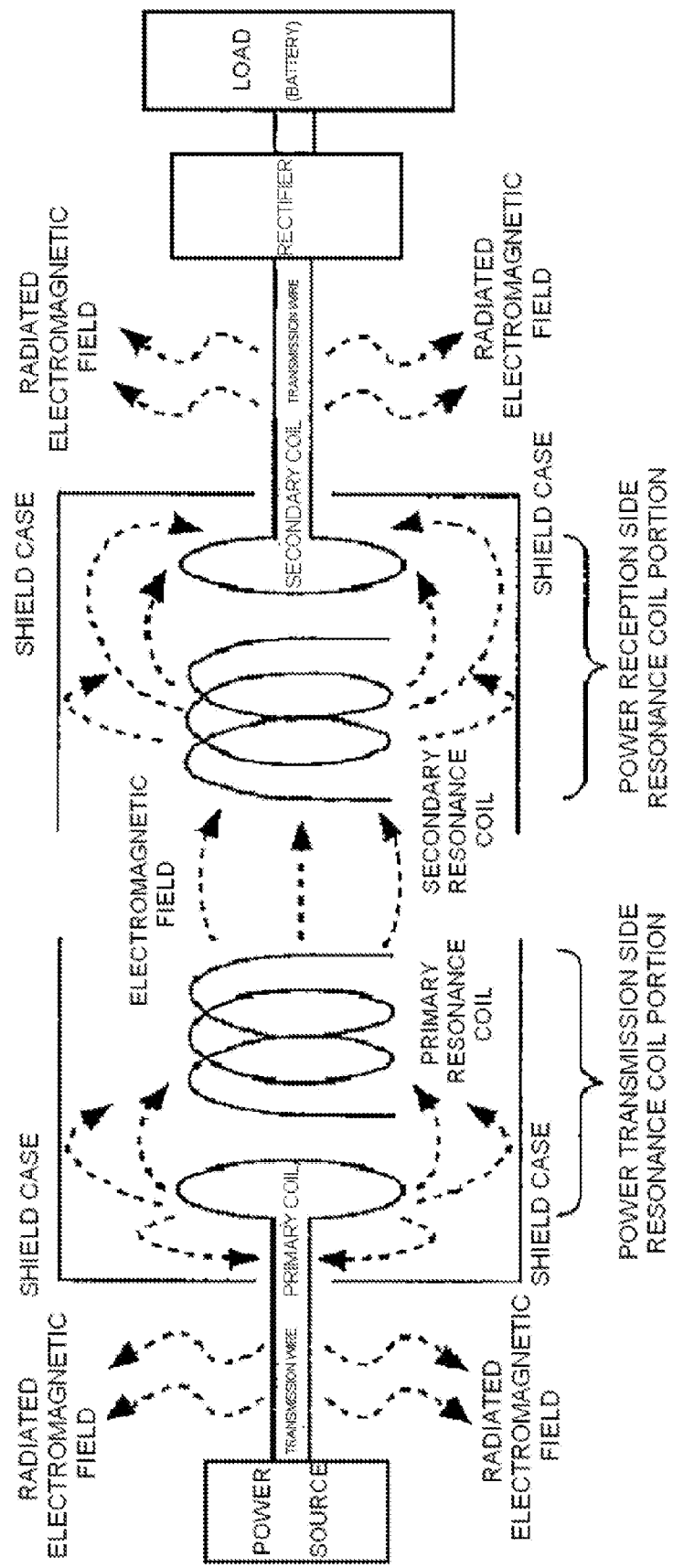
FIG. 3 is a diagram schematically showing the resonance type non-contact power feeding system according to the related art, which covers a resonance coil with a shield case.
Figure 4:
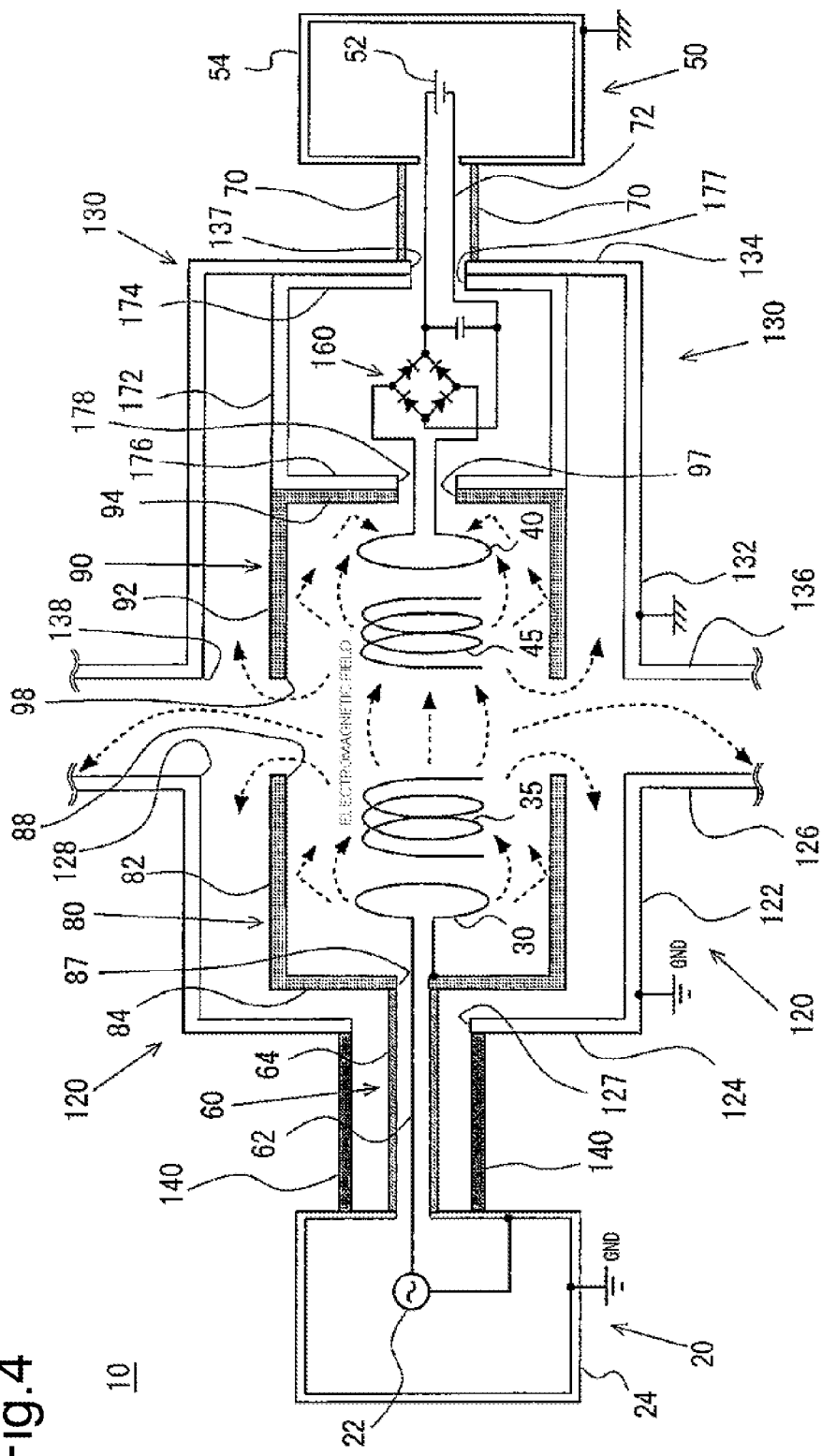
FIG. 4 is a diagram schematically showing a resonance type non-contact power feeding system according to an embodiment of the present invention.
Figure 5:
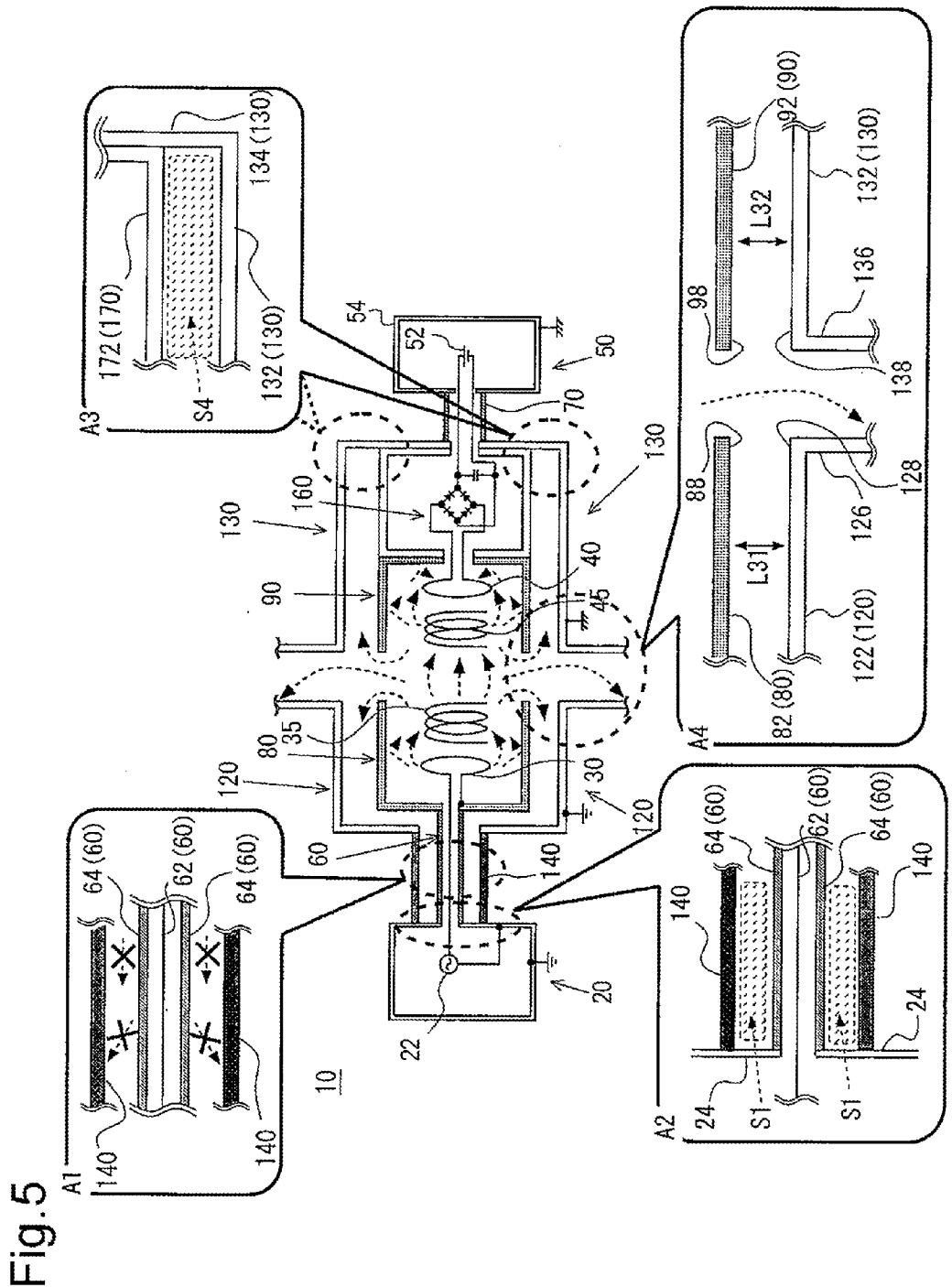
FIG. 5 is a diagram for explaining the characteristics of the resonance type non-contact power feeding system according to the embodiment of the present invention.

FIG. 4 is a diagram schematically illustrating the configuration of a resonance type non-contact power feeding system 10 according to this embodiment. In addition, FIG. 5 is a diagram for explaining characteristic configuration parts in this embodiment. As for the power transmission principle applied in the resonance type non-contact power feeding system, since the technique disclosed in the PTL 1 may be used, detailed description thereof will be omitted herein.

The resonance type non-contact power feeding system 10 includes, as a power transmission side (primary side) apparatus, a high-frequency power source 20, a primary coil 30, and a primary resonance coil 35. The primary coil 30 is connected to the high-frequency power source 20 using a power transmission side coaxial cable 60. More specifically, the high-frequency power source 20 includes an oscillation source 22 inside a power source housing 24 and is connected to the primary coil 30 by the power transmission side coaxial cable 60. In addition, the power source housing 24 is grounded to a ground GND. As a form of the grounding, the power source housing 24 may be grounded by a dedicated earth wire or may be grounded by an FG (Frame Ground) wire of an AC cable or the like.

Moreover, the resonance type non-contact power feeding system 10 includes a power transmission side metal shield 80 which is a first layer shield layer and covers the peripheries of the primary coil 30 and the primary resonance coil 35. The power transmission side metal shield 80 has a case shape made of metal such as steel or copper which is a good conductor so that, for example, a power reception side (a secondary side illustrated on the right) is an opening 88 (a power transmission side metal shield front surface side opening 88). That is, a shield side surface 82 of the power transmission side metal shield 80 completely covers the peripheries of the primary coil 30 and the primary resonance coil 35 excluding the power transmission side metal shield front surface side opening 88. More specifically, the primary resonance coil 35 is completely accommodated inside the power transmission side metal shield 80. In other words, in the illustration, the primary resonance coil 35 is shaped and disposed so that the foremost portion (on the right in the illustration) thereof is on the inner side (on the left in the illustration) relative to the power transmission side metal shield front surface side opening 88. Moreover, the power transmission side metal shield front surface side opening 88 may be configured to be blocked by an insulating lid material such as a resin material.

In addition, a shield bottom surface 84 of the power transmission side metal shield 80 is provided with a transmission opening for a transmission path between the high-frequency power source 20 and the primary coil 30 (a power transmission side metal shield bottom surface side opening 87), and the power transmission side coaxial cable 60 is connected to the transmission opening. More specifically, one end portion (on the right in the illustration) of the coaxial cable external conductor 64 of the power transmission side coaxial cable 60 is connected to the shield bottom surface 84 of the power transmission side metal shield 80 (the power transmission side metal shield bottom surface side opening 87). The other end portion (on the left in the illustration) of the coaxial cable external conductor 64 is connected to the power source housing 24 of the high-frequency power source 20. A coaxial cable internal conductor 62 directly connects the oscillation source 22 of the high-frequency power source 20 to the primary coil 30.

Moreover, the resonance type non-contact power feeding system 10 includes, as a second layer shield layer, a power transmission side large metal shield 120 and a coaxial metal shield 140.

The power transmission side large metal shield 120 is formed to cover the power transmission side metal shield 80. The power transmission side large metal shield 120 is made of metal which is a good conductor like the power transmission side metal shield 80, and has, for example, a case shape covering the power transmission side metal shield 80. Moreover, the power transmission side metal shield 80 and the power transmission side large metal shield 120 are disposed to be separated only by a predetermined distance L31, and the space between the power transmission side metal shield 80 and the power transmission side large metal shield 120 may be simply in a separated state or may be filled with an insulator. In addition, the power transmission side metal shield 80 and an opening 128 part of the power transmission side large metal shield 120 (a power transmission side large metal shield front surface side opening 128) part may be blocked by an insulating lid member.

In addition, at an end portion on the power transmission side large metal shield front surface side opening 128 side (the power reception side illustrated on the left), a surface-like (circular) large metal shield front surface portion 126 which extends outward from the end portion of the power transmission side large metal shield front surface side opening 128 is formed. The large metal shield front surface portion 126 and a large metal shield front surface portion 136 of a power reception side large metal shield 130 described later are disposed so that the surfaces thereof oppose each other. The sizes thereof are formed to sufficiently weaken the electromagnetic field at the outer end portion thereof.

In addition, a large metal shield bottom surface portion 124 formed on the high-frequency power source 20 side is provided with a power transmission side large metal shield bottom surface side opening 127 and is connected to one end portion of the tubular coaxial metal shield 140 covering the power transmission side coaxial cable 60. The other end portion of the coaxial metal shield 140 is connected to the power source housing 24 of the high-frequency power source 20. The power transmission side coaxial cable 60 and the coaxial metal shield 140 are also disposed to be separated by a predetermined distance. The coaxial metal shield 140 may electrically connect the power transmission side large metal shield 120 to the power source housing 24, and for example, a conductor tube or a shield braid structure may be employed. Moreover, the coaxial metal shield 140 may be given environmental resistance properties such as a waterproof function.

On the other hand, the resonance type non-contact power feeding system 10 includes, as a power reception side (secondary side) apparatus, a load device 50, a secondary coil 40, a secondary resonance coil 45, and a rectifier 160. A battery 52 is provided inside a load housing 54 of the load device 50.

Like the power transmission side metal shield 80 on the power transmission side, the resonance type non-contact power feeding system 10 includes a power reception side metal shield 90 that covers the secondary coil 40 and the secondary resonance coil 45, and a rectifier shield 170 that covers the rectifier 160.

Specifically, the power reception side metal shield 90 has a case shape made of metal such as steel or copper which is a good conductor so that, for example, the power transmission side (the primary side illustrated on the left) is an opening 98 (a power reception side metal shield front surface side opening 98). That is, a shield side surface 92 of the power reception side metal shield 90 completely covers the peripheries of the secondary coil 40 and the secondary resonance coil 45 excluding the opening.

In addition, a shield bottom surface 94 of the power reception side metal shield 90 is provided with a power reception side metal shield bottom surface side opening 97 for a transmission path between the rectifier 160 and the secondary coil 40.

The rectifier shield 170 is a cylindrical member made of metal such as steel or copper which is a good conductor and is formed to cover the rectifier 160. Here, the rectifier shield 170 and the power reception side metal shield 90 are configured to show an integrated tubular shape (for example, a rectangular parallelepiped or a cylinder) when predeterminately disposed. Moreover, a rectifier shield front surface portion 176 of the rectifier shield 170 and the shield bottom surface 94 of the power reception side metal shield 90 are connected in one body. The rectifier shield front surface portion 176 is provided with a rectifier shield front surface side opening 178 to be aligned with the power reception side metal shield bottom surface side opening 97 in a state where the shield bottom surface 94 and the rectifier shield front surface portion 176 are connected to each other. As a result, a space for a transmission path from the secondary coil 40 to the rectifier 160 is ensured.

The rectifier shield bottom surface portion 174 of the rectifier shield 170 is connected to the inner surface of a large metal shield bottom surface portion 134 of the power reception side large metal shield 130 described later. The rectifier shield bottom surface portion 174 is provided with a rectifier shield bottom surface side opening 177. The rectifier shield bottom surface side opening 177 ensures a space for a transmission path from the rectifier 160 to the battery 52.

The power reception side large metal shield 130 is made of metal which is a good conductor like the power reception side metal shield 90 or the rectifier shield 170, and has, for example, a case shape covering the power reception side metal shield 90 and the rectifier shield 170. The power reception side large metal shield 130 and the power reception side metal shield 90 are configured to maintain an electrically insulated state.

Moreover, at an end portion on the power reception side large metal shield front surface side opening 138 side (the power transmission side illustrated on the left) of the large metal shield side surface portion 132, a surface-like (circular) large metal shield front surface portion 136 which extends outward from the end portion of the opening is formed to be disposed so that the surface thereof is opposed to the surface of the large metal shield front surface portion 126 of the power transmission side large metal shield 120 described above.

The large metal shield bottom surface portion 134 is provided with a power reception side large metal shield bottom surface side opening 137. The power reception side large metal shield bottom surface side opening 137 is aligned with the rectifier shield bottom surface side opening 177 when the rectifier shield 170 is mounted at a predetermined position and configures a communication hole (a transmission space) in which a power transmission line from the rectifier 160 to the battery 52 is arranged.

In addition, the power reception side large metal shield 130 may have a form connected to the vehicle body at the same potential to configure a part of the vehicle body, or may have an independent configuration.

An output line shield 70 connects the power reception side large metal shield 130 to the load device 50 and covers the outside of an output line 72 from the rectifier 160 to the battery 52. More specifically, one end portion of the output line shield 70 is connected to the power reception side large metal shield bottom surface side opening 137, and the other end portion thereof is connected to the load housing 54 of the load device 50.

The operations of the resonance type non-contact power feeding system 10 having the above configuration will be simply described. The oscillation source 22 of the high-frequency power source 20 oscillates at a high frequency of, for example, several MHz to several tens of MHz to be supplied to the primary coil 30. The primary resonance coil 35 amplifies the power of the primary coil 30 and generates an electromagnetic field toward the secondary resonance coil 45. The secondary resonance coil 45 is coupled with the electromagnetic field generated by the primary resonance coil 35 to cause induced current in the secondary coil 40. The induced current is converted into direct current by the rectifier 160 to be supplied to the battery 52.

Here, on the power transmission side (infrastructure side) of the resonance type non-contact power feeding system according to the related art described above, the induced current flows to the ground GND through not only the inside of the coaxial cable external conductor 64 of the power transmission side coaxial cable 60 but also the outside of the coaxial cable external conductor 64, such that a radiated electromagnetic field is generated in the vicinity of the power transmission side coaxial cable 60. On the power reception side of the resonance type non-contact power feeding system, not all the electromagnetic field from the secondary resonance coil is coupled with the secondary coil, but a part of the electromagnetic field is coupled with the transmission line (the output line), the rectifier, or the like to generate induced current which becomes transmission loss, resulting in generation of the radiated electromagnetic field in the vicinity thereof.

However, in this embodiment, first, in the power transmission side (infrastructure side) apparatus, collection of the transmission energy in the power transmission side coaxial cable 60 is enhanced. Since the power transmission side coaxial cable 60 which is a coaxial line is used as the transmission power supply line, transmission power is efficiently transmitted, thereby realizing a reduction in loss.

In addition, the periphery of the resonance part (the primary coil 30 and the primary resonance coil 35) of the power transmission side (the primary side) is covered by the power transmission side metal shield 80 which is a first layer shield structure, and the power transmission side metal shield 80 is electrically connected to the coaxial cable external conductor 64 of the power transmission side coaxial cable 60, so that current flowing out from the coaxial cable external conductor 64 on the power transmission side can be collected in the coaxial cable external conductor 64. That is, the electromagnetic field generated from the primary resonance coil 35 can be prevented from being coupled with the outside of the coaxial cable external conductor 64.

Moreover, as shown in the enlarged part A1 of FIG. 5, on the outside of the power transmission side coaxial cable 60, as the second layer shield structure, the coaxial metal shield 140 and the power transmission side large metal shield 120 which cover the power transmission side coaxial cable 60 and the power transmission side metal shield 80 are disposed. In addition, in the enlarged part A1, the power transmission side coaxial cable 60 and the coaxial metal shield 140 are the focus of the illustration. By employing this configuration, the electromagnetic field leaking from the power transmission side coaxial cable 60 and the electromagnetic field leaking from the primary resonance coil 35 can be confined, so that the radiated electromagnetic field can be reduced.

In addition, as shown in the enlarged part A2 of FIG. 5, the power source housing 24, the coaxial metal shield 140, and the coaxial cable external conductor 64 are connected to be at the same potential. By this configuration, an enclosed space S1 is formed by the equipotential surfaces, and the electromagnetic field leaking from the power transmission side coaxial cable 60 and the electromagnetic field leaking from the primary resonance coil 35 are configured therein, so that radiated electromagnetic field is reduced.

Next, the features of the power reception side (the vehicle side) will be described. By the power reception side metal shield 90 that covers the secondary resonance coil 45, the electromagnetic field generated from the secondary resonance coil 45 is prevented from being electromagnetically coupled with the rectifier 160 or the output line 72 that transmits power from the rectifier 160 to the battery 52.

The rectifier 160 is disposed just by the side of the secondary resonance coil 45 (the secondary coil 40). Therefore, a reduction in transmission efficiency by the transmission line can be prevented.

Moreover, as shown in the enlarged part A3 of FIG. 5, the power reception side metal shield 90, the rectifier shield 170, and the vehicle body are connected to be at the same potential. By this configuration, an enclosed space S4 is formed by the equipotential surfaces, and the radiated electromagnetic field from the secondary resonance coil 45 or the secondary coil 40 is surrounded by metal surfaces which are electrically stable, so that radiation of the electromagnetic field into the vehicle can be reduced. Moreover, electromagnetic coupling with the output line 72 can be prevented.

In addition, the output line 72 from the rectifier 160 to the battery 52 is shielded by the potential of the vehicle body. As a result, the radiated electromagnetic field in the vehicle of the electromagnetic field generated from ripple noise from the rectifier 160 can be reduced.

Moreover, as shown in the enlarged part A4 of FIG. 5, since a space between the opposing large metal shield front surfaces portions 126 and 136 can be sufficiently ensured in the outward radial direction, the intensity of the leaking electromagnetic field can be sufficiently reduced. Furthermore, the distance L31 between the shield side surface 82 of the power transmission side metal shield 80 and the large metal shield side surface portion 122 of the power transmission side large metal shield 120, and the distance L32 between the shield side surface 92 of the power reception side metal shield 90 and the large metal shield side surface portion 132 of the power reception side large metal shield 130 are caused to be sufficiently close to each other. By this configuration, the electromagnetic field between the power transmission side metal shield front surface side opening 88 and the power transmission side large metal shield front surface side opening 128, and the electromagnetic field between the power reception side metal shield front surface side opening 98 of the power reception side metal shield 90 and the power reception side large metal shield front surface side opening 138 of the power reception side large metal shield 130 can be reduced.

The foregoing description has been provided on the basis of the embodiments of the present invention. It should be understood by those skilled in the art that the embodiments are only examples, various modified examples from components and combinations thereof can be made, and the modified examples are within the scope of the present invention.

Figure 6:
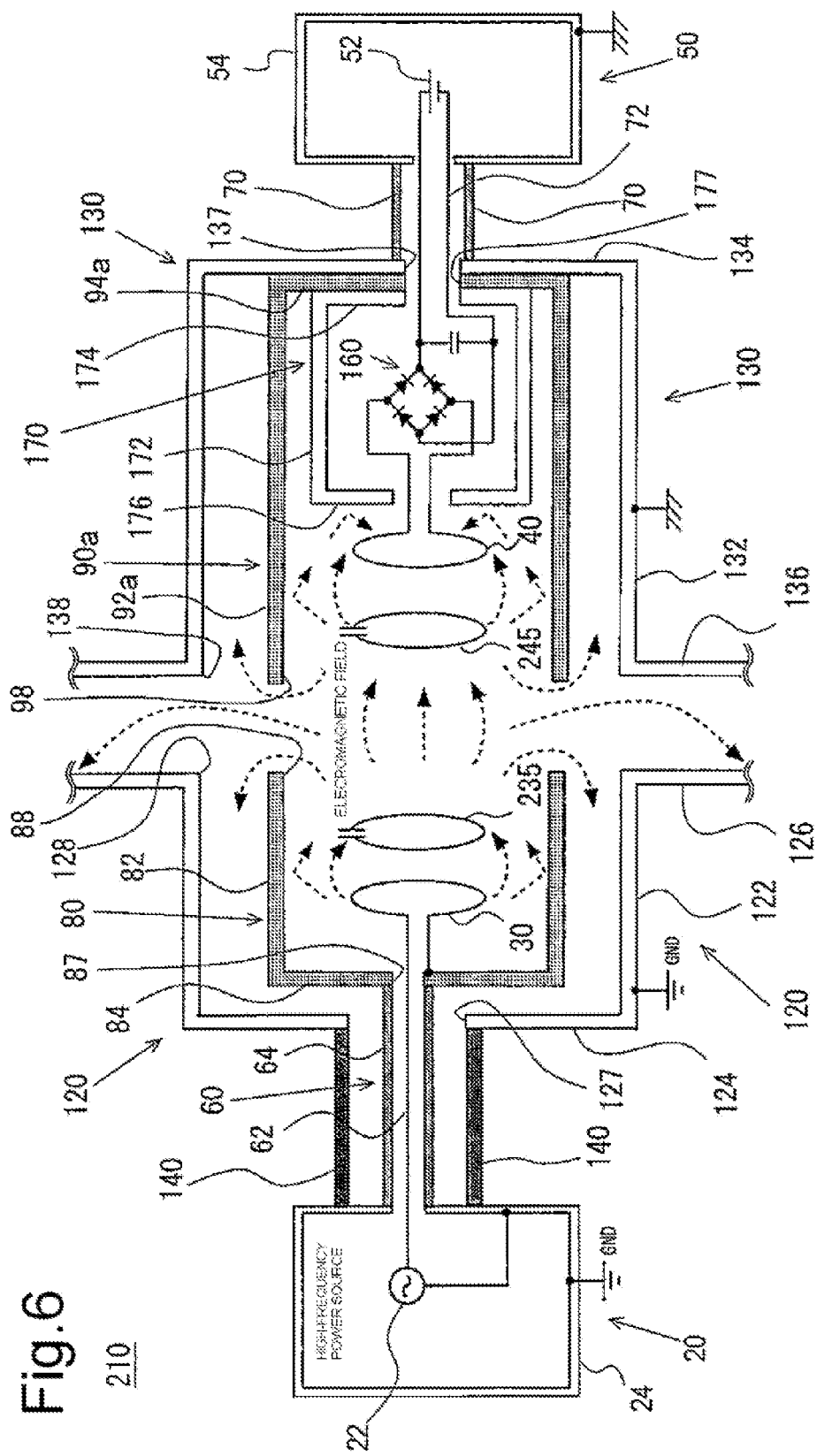
FIG. 6 is a schematic diagram showing the configuration of a resonance type non-contact power feeding system according to a modified example of the embodiment of the present invention.

FIG. 6 shows a form of a resonance type non-contact power feeding system 210 related to such a modified example. This is different from the resonance type non-contact power feeding system 10 described above in that, first, an LC oscillator is used as the resonance coil. Specifically, a power transmission side LC oscillator 235 is used instead of the primary resonance coil 35 which is a self-resonant type, and a power reception side LC oscillator 245 is used instead of the secondary resonance coil 45. In addition, the resonance coil is not intended to be limited to the form described above, and any one that functions as a resonance coil may be used.

The next difference is that the rectifier 160 is disposed inside a power reception side metal shield 90a. Specifically, the rectifier 160 and the rectifier shield 170 which is a shield case thereof are disposed inside the power reception side metal shield 90a. In addition, the power reception side metal shield 90a is mounted to the inner surface of the large metal shield bottom surface portion 134 of the power reception side large metal shield 130. Here, the power reception side large metal shield 130, the power reception side metal shield 90a, and the rectifier shield 170 are at the same potential as that of the vehicle body. By such a configuration, the same effects as those of the embodiment described above are obtained.

This application is based upon and claims the benefit of priority of Japanese Patent Application No. 2011-096366 filed on Apr. 22, 2011, the contents of which are incorporated herein by reference.

INDUSTRIAL APPLICABILITY

According to the present invention, a technique for reducing a radiated electromagnetic field which is unnecessary in a resonance type non-contact power feeding system can be provided.

REFERENCE SIGNS LIST

10, 210: RESONANCE TYPE NON-CONTACT POWER FEEDING SYSTEM
20: HIGH-FREQUENCY POWER SOURCE
22: OSCILLATION SOURCE
24: POWER SOURCE HOUSING
30: PRIMARY COIL
35: PRIMARY RESONANCE COIL
40: SECONDARY COIL
45: SECONDARY RESONANCE COIL
50: LOAD DEVICE
52: BATTERY
54: LOAD HOUSING
60: POWER TRANSMISSION SIDE COAXIAL CABLE
62: COAXIAL CABLE INTERNAL CONDUCTOR
64: COAXIAL CABLE EXTERNAL CONDUCTOR
70: OUTPUT LINE SHIELD
72: OUTPUT LINE
80: POWER TRANSMISSION SIDE METAL SHIELD
82, 92, 92a: SHIELD SIDE SURFACE
84, 94, 94a: SHIELD BOTTOM SURFACE
87: POWER TRANSMISSION SIDE METAL SHIELD BOTTOM SURFACE SIDE OPENING
88: POWER TRANSMISSION SIDE METAL SHIELD FRONT SURFACE SIDE OPENING 90, 90a: POWER RECEPTION SIDE METAL SHIELD
97: POWER RECEPTION SIDE METAL SHIELD BOTTOM SURFACE SIDE OPENING
98: POWER RECEPTION SIDE METAL SHIELD FRONT SURFACE SIDE OPENING
120: POWER TRANSMISSION SIDE LARGE METAL SHIELD
122, 132: LARGE METAL SHIELD SIDE SURFACE PORTION
124, 134: LARGE METAL SHIELD BOTTOM SURFACE PORTION
126, 136: LARGE METAL SHIELD FRONT SURFACE PORTION
127: POWER TRANSMISSION SIDE LARGE METAL SHIELD BOTTOM SURFACE SIDE OPENING
128: POWER TRANSMISSION SIDE LARGE METAL SHIELD FRONT SURFACE SIDE OPENING
130: POWER RECEPTION SIDE LARGE METAL SHIELD
137: POWER RECEPTION SIDE LARGE METAL SHIELD BOTTOM SURFACE SIDE OPENING
138: POWER RECEPTION SIDE LARGE METAL SHIELD FRONT SURFACE SIDE OPENING
140: COAXIAL METAL SHIELD
160: RECTIFIER
170: RECTIFIER SHIELD
172: RECTIFIER SHIELD SIDE SURFACE PORTION
174: RECTIFIER SHIELD BOTTOM SURFACE PORTION
176: RECTIFIER SHIELD FRONT SURFACE PORTION
177: RECTIFIER SHIELD BOTTOM SURFACE SIDE OPENING
178: RECTIFIER SHIELD FRONT SURFACE SIDE OPENING
235: POWER TRANSMISSION SIDE LC OSCILLATOR
245: POWER RECEPTION SIDE LC OSCILLATOR

The invention claimed is:

1. A resonance type non-contact power feeding system which transmits power from a power transmission side resonance coil portion to a power reception side resonance coil portion by a non-contact resonance action,
wherein a power transmission side apparatus including the power transmission side resonance coil portion includes:
a power transmission side coaxial cable which electrically connects a high-frequency power source to the power transmission side resonance coil portion;
a first power transmission side shielding unit covering the power transmission side resonance coil portion from outside with a good conductor; and
a second power transmission side shielding unit covering the power transmission side coaxial cable and the first power transmission side shielding unit;
wherein an external conductor of the power transmission side coaxial cable, the first power transmission side shielding unit, a housing of the high-frequency power source, and the second power transmission side shielding unit are connected at the same potential; and
wherein a power reception side apparatus including the power reception side resonance coil portion includes:
a first power reception side shielding unit covering the power reception side resonance coil portion from outside with a good conductor;
a second power reception side shielding unit covering a rectifier that rectifies alternating current generated in the power reception side resonance coil portion into direct current, from outside with a good conductor;
a third power reception side shielding unit covering the first power reception side shielding unit and the second power reception side shielding unit, and
an output line shielding unit covering, in output lines from the rectifier to a load device, the output line in a section from the third power reception side shielding unit to a housing of the load device; and
wherein the first power reception side shielding unit, the second power reception side shielding unit, the third power reception side shielding unit, and the output line shielding unit are connected at the same potential.

2. The resonance type non-contact power feeding system according to claim 1, wherein the second power transmission side shielding unit and the third power reception side shielding unit respectively have surfaces extending outward at opposing end portions thereof.

3. An in-vehicle charging apparatus which, by a resonance type non-contact power feeding method for transmitting power from a power transmission side resonance coil portion to a power reception side resonance coil portion by a non-contact resonance action, mounts the power reception side resonance coil portion and a battery in a vehicle to perform charging, comprising:
a first power reception side shielding unit covering the power reception side resonance coil portion from outside with a good conductor;
a second power reception side shielding unit covering a rectifier that rectifies alternating current generated in the power reception side resonance coil portion into direct current, from outside with a good conductor;
a third power reception side shielding unit covering the first power reception side shielding unit and the second power reception side shielding unit; and
an output line shielding unit covering, in output lines from the rectifier to a load device, the output line in a section from the third power reception side shielding unit to a housing of the load device,
wherein the first power reception side shielding unit, the second power reception side shielding unit, the third power reception side shielding unit, and the output line shielding unit are connected at the same potential.

4. The in-vehicle charging apparatus according to claim 3, wherein the third power reception side shielding unit is configured integrally with a vehicle body.

5. A power transmission side apparatus having a power transmission side resonance coil portion in a resonance type non-contact power feeding system which transmits power from the power transmission side resonance coil portion to a power reception side resonance coil portion by a non-contact resonance action, comprising:
a power transmission side coaxial cable which electrically connects a high-frequency power source to the power transmission side resonance coil portion;
a first power transmission side shielding unit covering the power transmission side resonance coil portion from outside with a good conductor; and
a second power transmission side shielding unit covering the power transmission side coaxial cable and the first power transmission side shielding unit,
wherein an external conductor of the power transmission side coaxial cable, the first power transmission side shielding unit, a housing of the high-frequency power source, and the second power transmission side shielding unit are connected at the same potential.

* * * * *